United States Patent
Aller et al.

(10) Patent No.: US 7,315,994 B2
(45) Date of Patent: Jan. 1, 2008

(54) METHOD AND DEVICE FOR AUTOMATED LAYER GENERATION FOR DOUBLE-GATE FINFET DESIGNS

(75) Inventors: Ingo Aller, Weil im Schoenbuch (DE); Veit Gernhoefer, Boeblingen (DE); Joachim Keinert, Altdorf (DE); Thomas Ludwig, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 11/001,297

(22) Filed: Dec. 1, 2004

(65) Prior Publication Data
US 2005/0136582 A1 Jun. 23, 2005

(30) Foreign Application Priority Data
Dec. 22, 2003 (EP) ................................... 03104921

(51) Int. Cl.
G06F 17/50 (2006.01)
(52) U.S. Cl. ............................................. 716/5; 716/11
(58) Field of Classification Search .................... 716/5, 716/11, 17
See application file for complete search history.

(56) References Cited

U.S. PATENT DOCUMENTS

| | | | |
|---|---|---|---|
| 5,414,636 A * | 5/1995 | Ema ............................. | 716/19 |
| 6,413,802 B1 | 7/2002 | Hu et al. ..................... | 438/151 |
| 6,662,350 B2 * | 12/2003 | Fried et al. ................... | 716/11 |
| 7,013,447 B2 * | 3/2006 | Mathew et al. ................ | 716/11 |
| 7,187,046 B2 * | 3/2007 | Wu et al. .................... | 257/412 |

OTHER PUBLICATIONS

"FinFET Technology for Future Microprocessors", T. Ludwig et al., 2003 IEEE International SOI Conference, Newport Beach, CA, pp. 33-34, ISBN 0-7803-7815-6.

* cited by examiner

Primary Examiner—Paul Dinh
Assistant Examiner—Binh Tat
(74) Attorney, Agent, or Firm—John E. Campbell; Fleit, Kain, Gibbons, Gutman & Bongini

(57) ABSTRACT

In a FinFET integrated circuit design, a combined cell structure contains two single cell structures at a first design hierarchy having fin shapes, the cell structures are placed adjacent to each other. The combined fin shapes of the two single cell structures at the first design hierarchy lead to a violation of a design rule related to fin topology in the overlapping region. A fin generation tool thus decides not to place the fins in the first design hierarchy. The fin generation is delegated another design hierarchy resulting in the generation of a single combined fin for both single cells.

8 Claims, 16 Drawing Sheets

Hierarchy n:
(Design)

Hierarchy n+1:
(Design)

Groundrule violation (minimum shape width)

After processing:

No electrical connection between areas ("open")

METHOD AND DEVICE FOR AUTOMATED LAYER GENERATION FOR DOUBLE-GATE FINFET DESIGNS

REFERENCED DOCUMENTS

U.S. Pat. No. 6,252,284 B1, assigned to the present assignee and relating among others to a process for fabricating a planarized silicon fin device according to the present invention, is regarded to be fully incorporated herein by reference.

Further, an article by the present inventors, entitled "FinFET Technology for Future Microprocessors" and published in 2003 IEEE International SOI Conference, Newport Beach, Calif., page 33-34, ISBN 0-7803-7815-6, is also regarded to be fully incorporated herein by reference.

FIELD OF THE INVENTION

The present invention generally relates to Field Effect Transistors (FETs) as well as to Metal-Oxide Semiconductor (MOS) and Complementary Metal-Oxide Semiconductor (CMOS) devices and their chip design. More specifically, the invention concerns a method and device for designing an according device structure particularly including double-gate fin based field-effect transistor (FinFET) technology and a method and device for the conversion of an existing not fin-based design into a corresponding fin-based design.

BACKGROUND OF THE INVENTION

As known in the art, a double-gate transistor structure effectively doubles the electrical current that can be sent through a given transistor. The latest structures are particularly fabricated by means of a thin vertical Silicon (Si) process thus revealing a so-called "FIN Field Effect Transistor" (FinFET) design that relies upon a thin vertical silicon "fin" to help control leakage of current through the transistor when it is in the "off" state (FIG. 1A). This new design approach allows for the creation of new chips with enhanced performance and ever-shrinking feature sizes and geometries. Therefore the mentioned superior leakage control characteristics make FinFET transistors an attractive candidate for future nano-scale CMOS generations since the FinFET process pushes gate lengths below 50 nm.

More particularly, the mentioned CMOS FinFETs are generated through a conventional process or the process steps described in more detail hereinafter (so-called "Sidewall Image Transfer" (SIT) process). When materials are deposited by chemical vapour deposition (CVD) or sputtering processes they typically cover topography in a conformal manner. This means that the vertical thickness of the material deposited at the edge of a step approaches the thickness of the material deposited in flat regions, plus the height of the step. As a consequence, when flat field areas are cleared during dry etching, non-etched material will remain at the edge of the steps in form of a spacer. This sidewall spacer, the width of which is the thickness of the deposited layer in the field regions, can only be removed through additional etching. But instead of etching away the sidewall spacer, the material that formed the step (mandrel) can be selectively etched leaving behind a free-standing spacer, the width of which is the thickness of the original deposited material. In other words, only the combination of surface topography and dry etching inevitably leads to the formation of said sidewall spacers.

The mentioned SIT process is illustrated in more detail referring to FIGS. 1B-1D, each relating to one process step. The shown SIT process is applied to a silicon substrate 105 that comprises an oxide layer 115 on the bottom. Left-hand shown are three plan views showing a mandrel structure 100 out of which a fin loop 120 is generated which represents an active area for the later FinFET. During an intermediate process step, the structure comprises a spacer 110. For a better understanding of the spatial geometry of the structures 100-120, the three process steps (FIGS. 1B-1D) are illustrated right-hand by means of cross-sectional views. As can be seen particularly right-hand in FIG. 1D, as a result of the three process steps, the silicon 105 is being etched using the intermediate spacer 110 as an etching mask resulting in fins 120. This approach has been already used in the fabrication of CMOS FinFETs, so called because the free-standing active silicon spacers resemble fins.

In addition, the designing of these planar CMOS structures involves some design rules. In particular, there exist certain design rules for the design and fabrication of the mentioned fin-based transistor structures. These design rules can be violated in different ways what is illustrated in more detail making reference to FIGS. 2A and 2B.

An important design rule is related to the proximity effect between nearby and essentially parallel arranged fin structures. It is noteworthy that proximity between two fin structures can also be established only in a higher level of design hierarchy where additional regions are linked together, but not in the corresponding sub-level of the underlying circuit design hierarchy.

The mentioned design rules are now described in more detail referring to FIGS. 2A and 2B. The exemplary structural design may consist of two gates 'Gate 1' and 'Gate 2' 200, 210. The two dotted lines 220 and 230 depict the boundaries of the two gate areas 200, 210. The two gate areas 200, 210, before being assembled, in the present design level, can be understood as adjacent regions of the overall design. After being assembled, the two areas 200, 210 can be understood as contiguous regions. The resulting fin shapes 240 that overlap the two gate areas 200, 210 comprise step-like shapes 260, 270 in the intermediate or overlapping area between the two gate areas 200, 210. The step-like shapes 260, 270 result from an according shift (in vertical direction) between the two gate areas 200, 210 before their assembling. The two gate areas 200, 201, from a functional point of view, define a resulting active area 250 of the underlying FinFET.

In the middle of FIG. 2A, it is schematically illustrated how the resulting fin shapes 240' are after lithography and subsequent processing. The above mentioned step-like transitions 260, 270 are now deteriorated into inclined lines 260', 270'. The consequence of this behaviour is illustrated in more detail by way of the enlarged view at the bottom of FIG. 2A of the circular area 280. The deviation from a straight line within the gate area 210 causes a non-foreseeable electronic behaviour of the later FinFET since the fin 290 (and thus the transistor) is not aligned with the crystal orientation of the underlying silicon substrate which, in most cases, causing drastically degraded electronic characteristics, as will be well-understood by an average-skilled person. These changes in electronic properties represent an exemplary design rule violation.

Another example for design rules is illustrated in FIG. 2B with two independent fin shapes 300 and 310 on a design hierarchy level n. On a design hierarchy level n+1, after assembling the two fin shapes 300, 310, as shown in the middle of FIG. 2B, the fins 300, 310 comprise a shape width 320 that falls below the minimum shape width thus representing another kind of design rule violation. The consequences of this design rule violation can be seen in the bottom part of FIG. 2B wherein, after lithographic processing of the fin 300, 310, a gap is generated between the original two fin shapes 300, 310 thus resulting in a broken connection between the two gate areas (200, 210 in FIG. 2A) causing failure of the FinFET.

A contiguous region as mentioned beforehand is formed in such a way that the fin structures within a region are designed and placed according to the mentioned design rules. Thus, the process of deriving the shape of the region is governed by the design rules. It initiates from the gate of each FET and spreads out orthogonally to both sides. Depending on the space between the FETs and the design rules, such a region can cover only one FET gate, but mostly covers a number of FETs.

Generally speaking, the above described fin-based chip design process includes first a design phase where the geometry i.e. shape (area, width, spacing, overlap etc.) of a fin structure is generated. Based on such a generated design, a lithography process is conducted that, at the end, provides an electronic structure (circuit layout) wherein only the circuit layout potentially reveals the above described and not desired electronic effects i.e. not wished interferences between adjacent fins or even failure of the whole circuit.

Further, as another requirement for the design of an underlying structure, an already existing design based on non-FinFET technology must not be changed particularly due to topology requirements and reuse of masks when performing a design transition introducing FinFET technology.

The above discussed technical requirements, in many cases, cause violation of at least one of the mentioned design rules when designing a fin-based or fin -shaped structure or when converting a not fin-based/shaped into a fin-based/shaped structure.

It is therefore desirable to provide a reliable method and device which enable a design-keeping transition of an existing non-fin design structure to a functionally identical structure based on FinFET technology.

SUMMARY OF THE INVENTION

In order to solve the above mentioned objective, it has first been realized that the above discussed technical problem with interfering fin structures of two ore more contiguous design regions can be solved by proceeding or passing over from a present hierarchy level of the design, where violation of a design rule occurs, to a next higher level of the underlying design, in order to modify a given design in a manner that such interfering fin structures are avoided at least at the design level with the higher hierarchy.

A 'fin-shaped structure', in the present context, includes but is not limited to double gates, tri-gates or even all-around-gates (according to INTEL's nomenclature), and thereupon, even nano-tube structures.

The invention additionally concerns a corresponding design (layout) generation device for designing and generating fin-based structures, preferably FinFET structures that comprises means for FinFET specific layer generation and enables a widely automated conversion of an existing non fin-based structural layout (design) to a fin-based layout.

Integrated CMOS circuits using Double-Gate FinFETs require one or more additional design layers for processing. Using the invention, these layers can be generated in an automated way based on a subset of the existing design layers. In the past, the additional layers had to be designed manually.

As a result, the additional design layers required for FinFETs can now be generated automatically based on existing layers. In contrast to manual entry of these layers, the automatic generation reduces the design effort significantly. For large or complex chips, where manual FinFET design is not an option, the herein proposed method enables use of FinFET technology at all. Existing conventional CMOS chip designs can leverage FinFET technology using the herein proposed conversion process. The existing design layers for the planar CMOS process are not altered, thus, processing a design alternatively with or without FinFETs is possible.

It is emphasized that the invention can be applied to both a non-SIT ('SIT'=sidewall image transfer) process, i.e. conventional lithography process, utilizing two internal layers and one output layer and to a SIT process with two internal layers and two output layers, as becoming evident from the present description.

BRIEF DESCRIPTION OF THE DRAWINGS

The present invention will be described in more detail with reference to the accompanying drawing from which further features and advantages of the invention become evident wherein.

DETAILED DESCRIPTION OF PREFERRED EMBODIMENTS

Figure 1A:
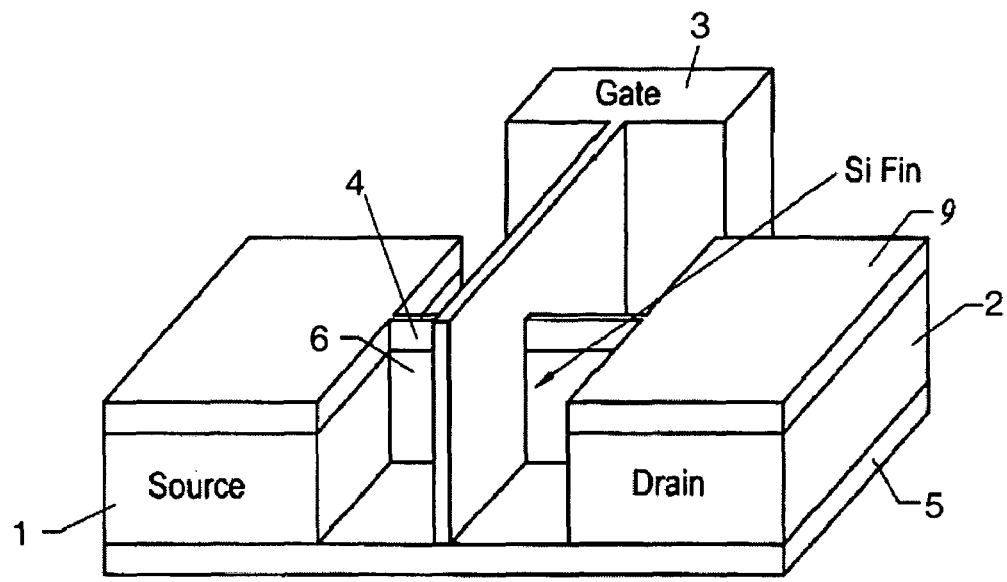
FIG. 1A is a perspective view of a FinFET device as known in the art.

Referring to the drawing, FIG. 1A illustrates in perspective a typical fin structure (in the present example a FET) in accordance with a known prior art approach. Such a planarized silicon fin device is disclosed e.g. in U.S. Pat. No. 6,252,284 by Paul Muller et al., assigned to the present assignee, issued Jun. 26, 2001. A corresponding double-gated FinFET transistor structure is disclosed e.g. in U.S. Pat. No. 6,413,802 assigned to University of California and issued Jul. 2, 2002.

In the structure shown in FIG. 1A, the device is fabricated on insulating layer 5, e.g. a Silicon-on-Insulator (SoI) substrate, and includes a silicon drain island 2 and a source island 1 connected by a silicon fin or channel 6. The source, drain and channel are covered by a dielectric layer 9 (hard mask), and a gate 3 extends across the channel fin 4 and is isolated therefrom by gate oxide and the hard mask. The channel 6 extends horizontally on the substrate 5 with the gates in planes on either side of the channel 6. Thus, inversion layers are formed on both sides of the channel.

The transistor structure shown in FIG. 1A has the advantage of providing double gates to effectively suppress short channel effects and enhance drive current. Since the channels are parallel planes there is no problem with corner effects, and since the fin is very thin, doping of the fin is not required to suppress short channel effects. The threshold voltage of the device can be controlled by adjusting the work function of the gate, for example, by using silicon-germanium alloy or a refractory metal or a compound such as titanium nitride.

Referring now to FIGS. 3A-3K, an exemplary process for fabricating a typical MOSFET-based fin device like that described beforehand referring to FIG. 1 and also being disclosed in U.S. Pat. No. 6,252,284 B1 assigned to the present assignee is shortly illustrated.

Figure 3A:
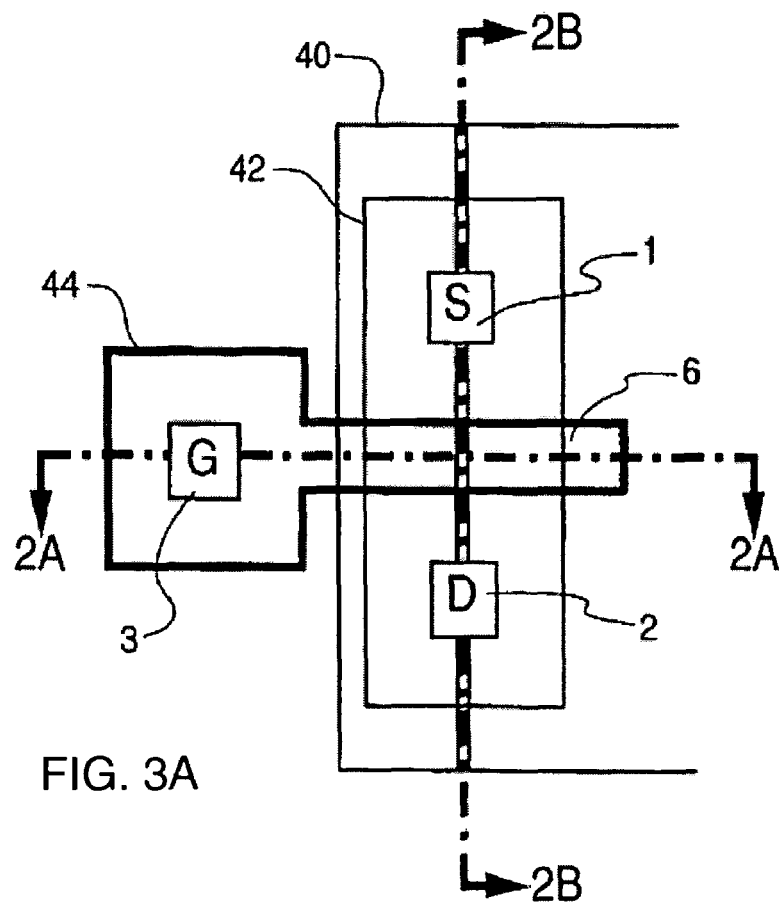
FIGS. 3A-3L are cross-sectional views of a FinFET device shown in FIG. 1 for further illustration of the known process steps for fabrication of such a device.
Figure 1B:
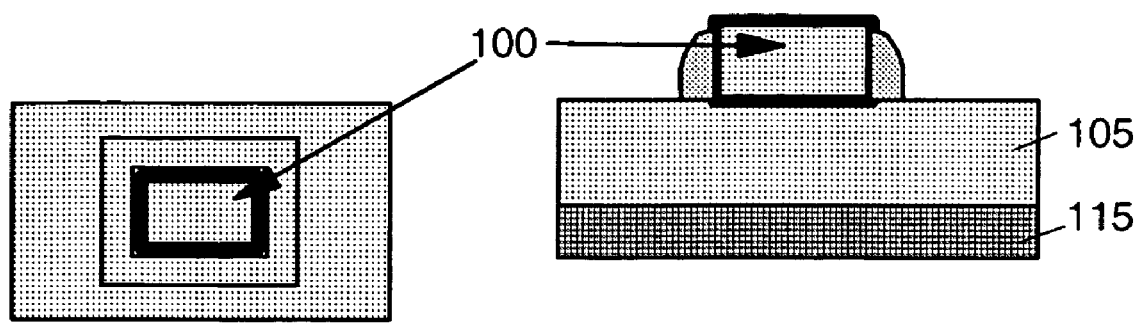
FIGS. 1B-1D are schematic views of exemplary FinFET structures in order to illustrate the mentioned SIT process known in the art.
Figure 1C:
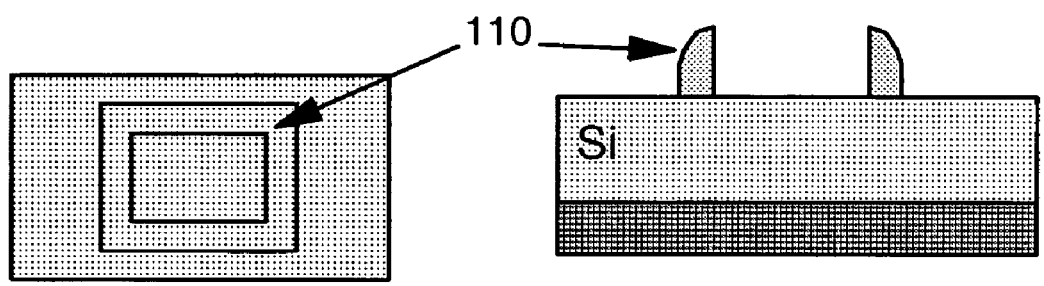
Figure 1D:
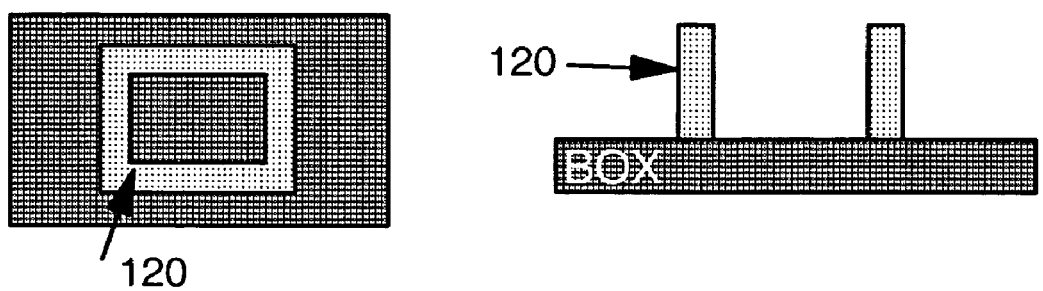
Figure 2A:
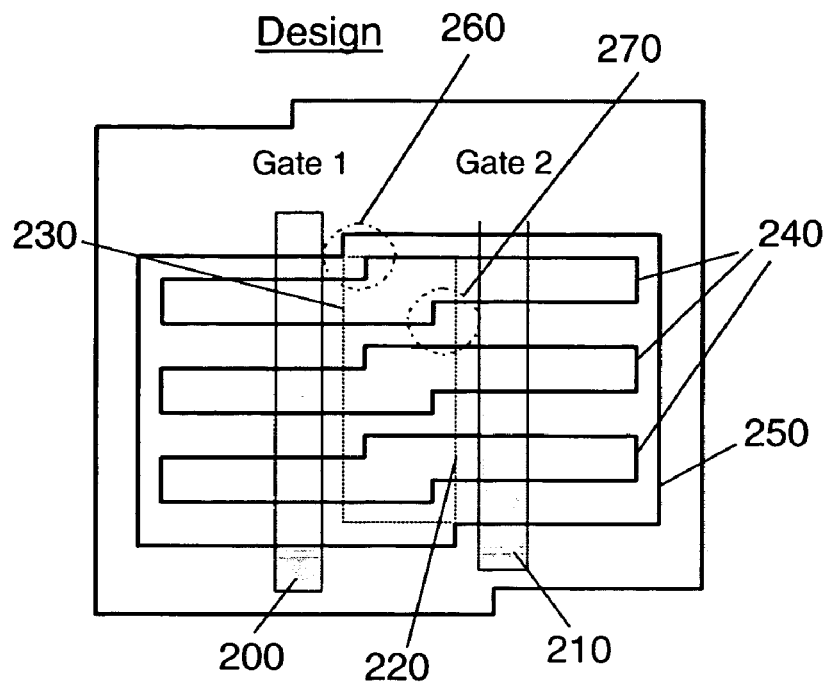
FIGS. 2A, 2B are schematic views of FinFET designs for illustration of design rules, their possible violation and the revealing negative effects (side effects)
Figure 2A:
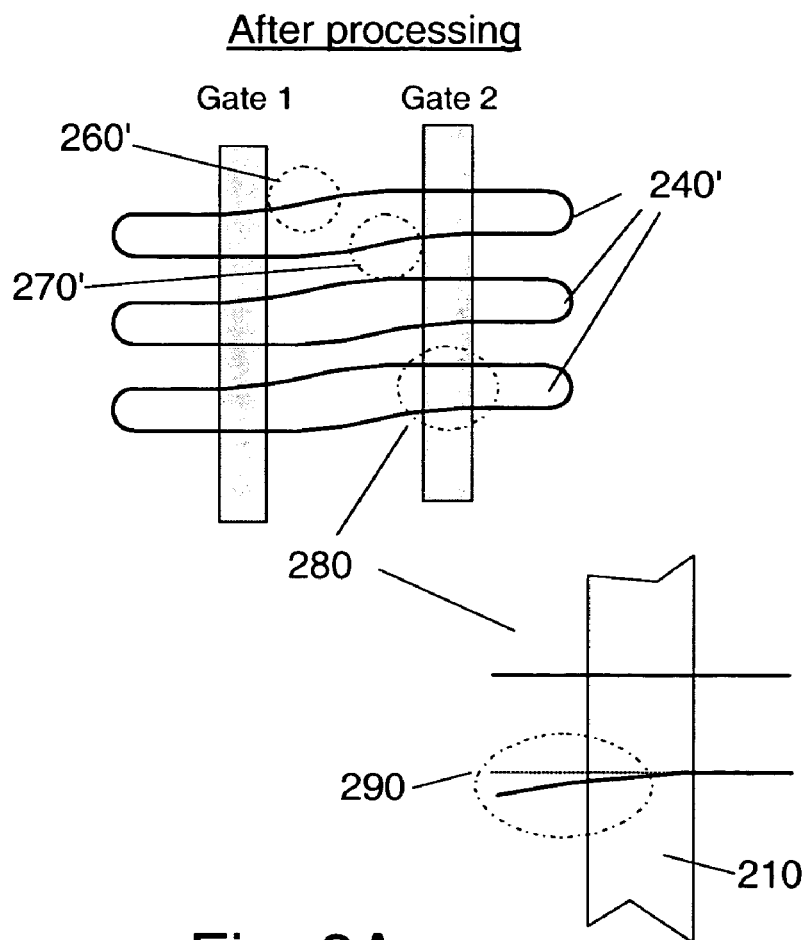
Figure 2B:
Figure 2B:
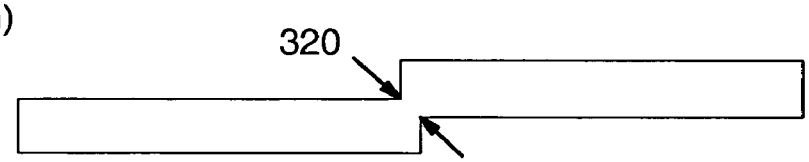
Figure 2B:
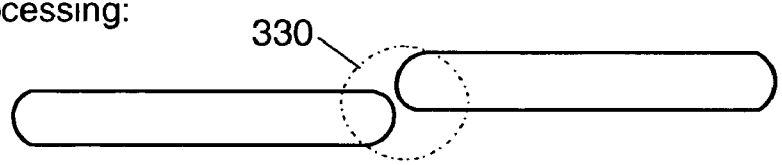
Figure 3B:
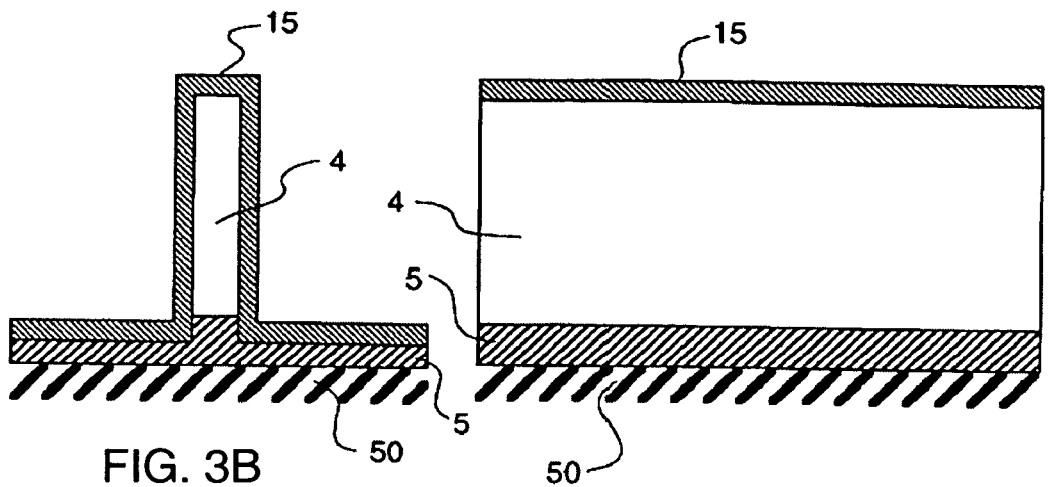

As shown in FIG. 3A, there are several components used in the process of manufacturing the fin device. One of these components is a fin trim mask 40. Also shown are a mask 42 used to form the source 1 and drain 2, and a photo-crystalline mask 44 used to form the gate 3.

In the FIGS. 3A-3K, there are shown cross-sectional views of the fin device in form of snapshots taken during the fabrication process, namely such views observed through the gate 3 and centered across a line connecting source 1 and drain 2.

Figure 3C:
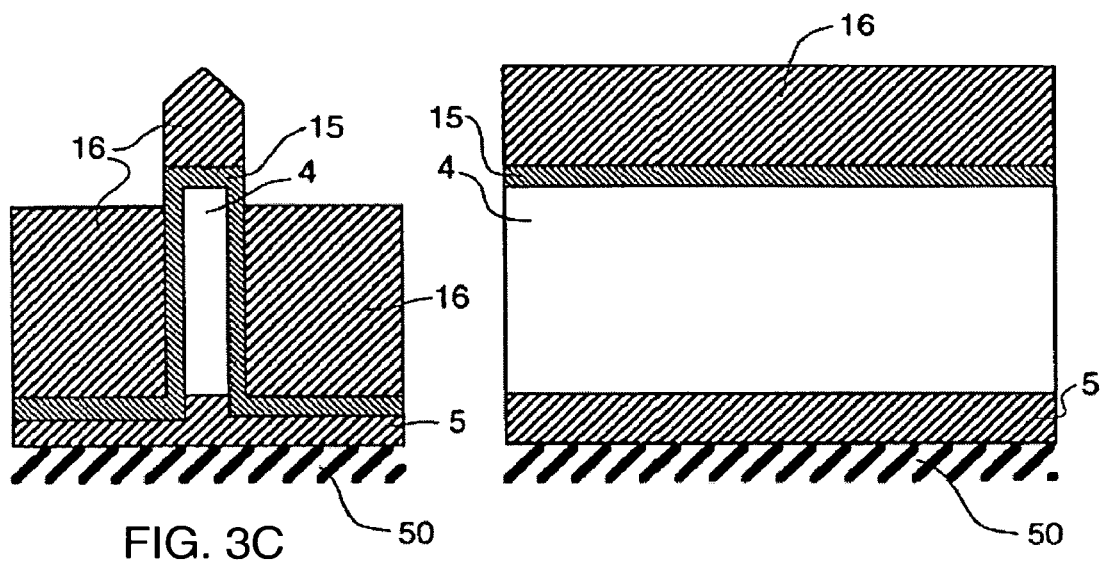

The first process step is forming a vertical fin 4 on the substrate 5, as shown in FIG. 3A. The fin 4 may be formed by silicon dioxide spacer deposition. According to FIG. 3B, an oxide layer 16 is next deposited over the nitride layer 15. The thickness of the oxide layer is used to set or adjust the desired height of the vertical fin 4. In the next step shown in FIG. 3C an oxide etching is used to remove a portion of the oxide layer 16 from either side of the fin 4. A nitride etching is also performed in order to remove the nitride layer 15 from the top of the fin 4 and a portion of the nitride layer 15 on the sides of the fin 4. As also shown in FIG. 3C, a poly-silicon layer 17 is next deposited on tops of the oxide layer 16, the nitride layer 15, and the exposed fin 4.

Figure 3D:
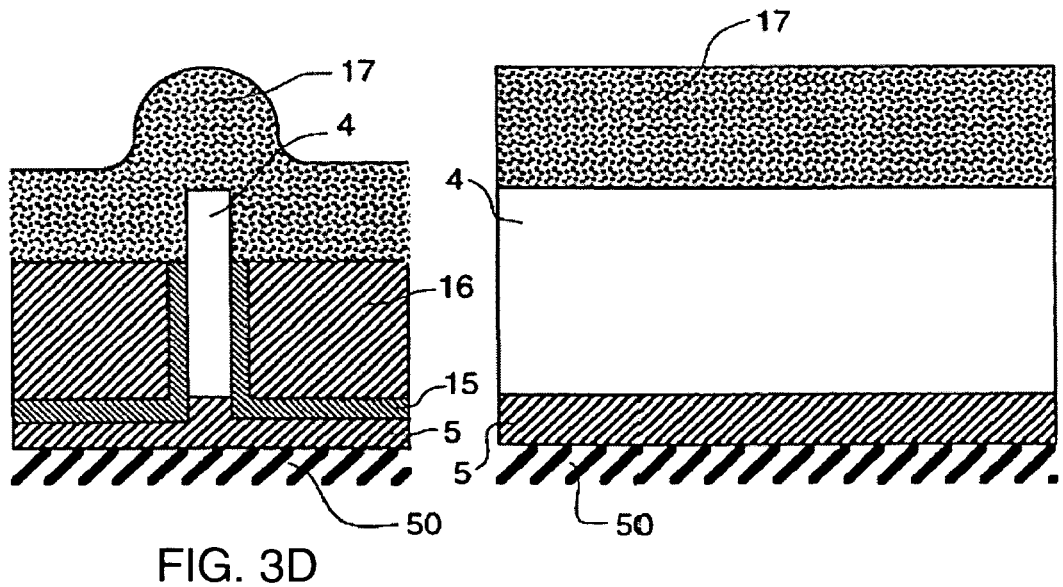
Figure 3E:
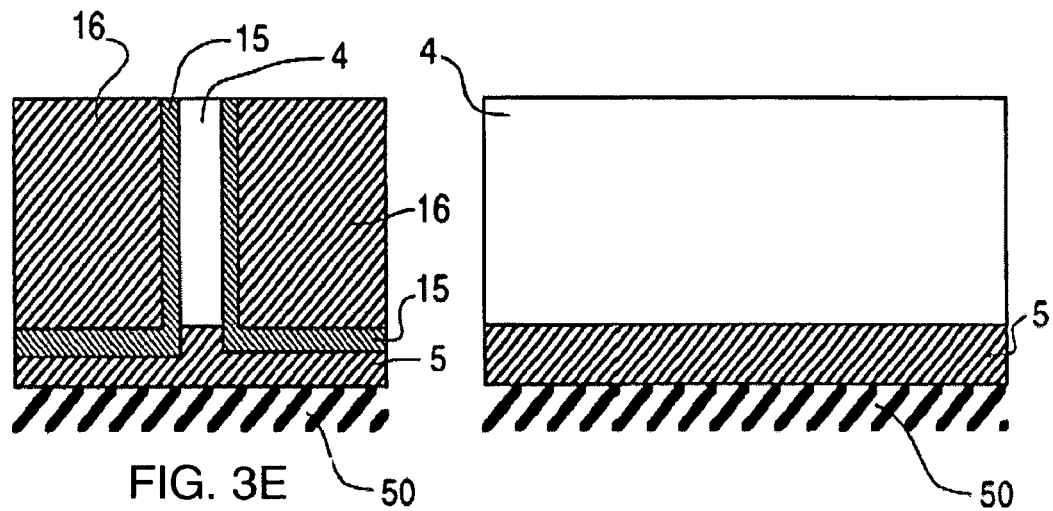

The height of the fin 4 is next adjusted by polishing the poly-silicon layer 17 and the fin 4 as illustrated in FIG. 3D. The fin 4 is next completely exposed by removal of the oxide layer 16 and the nitride layer 15 as shown in FIG. 3E.

Figure 3F:
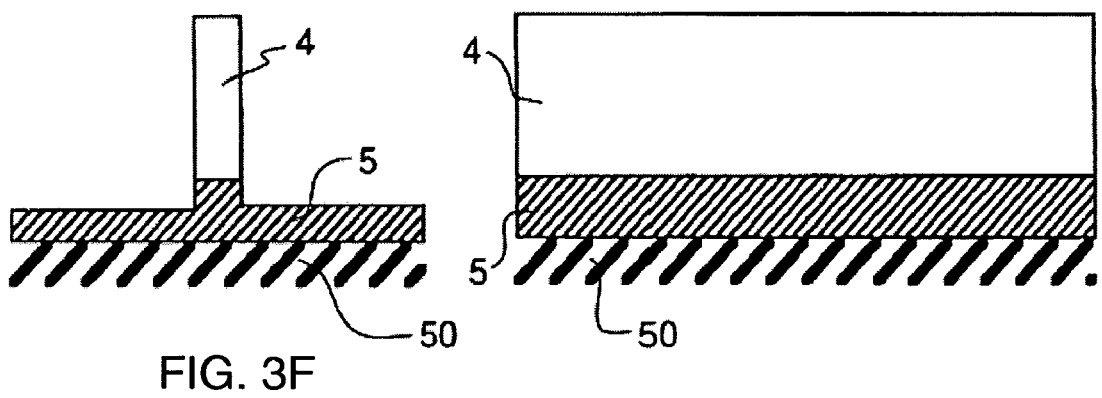

As illustrated in FIG. 3F, the next step is incorporating channel implants on either side of the fin 4 and then depositing a new oxide material.

Figure 3G:
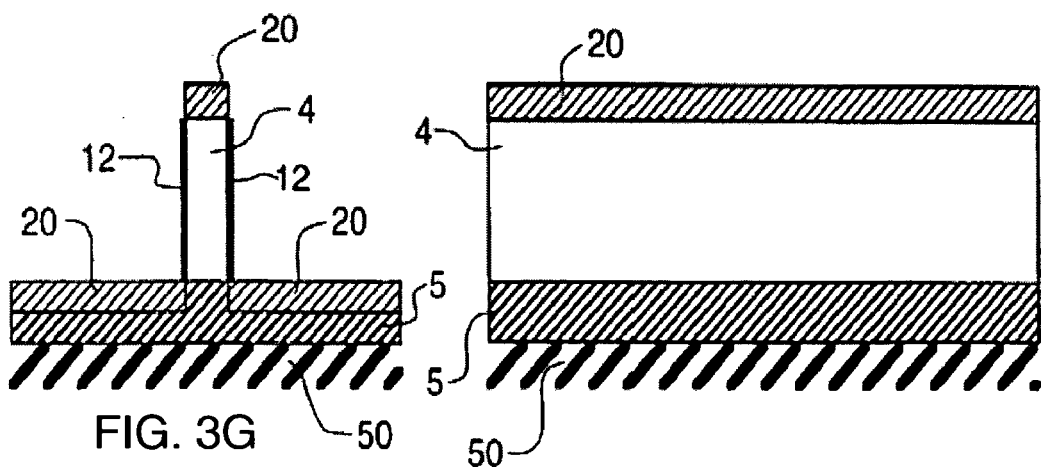
Figure 3H:
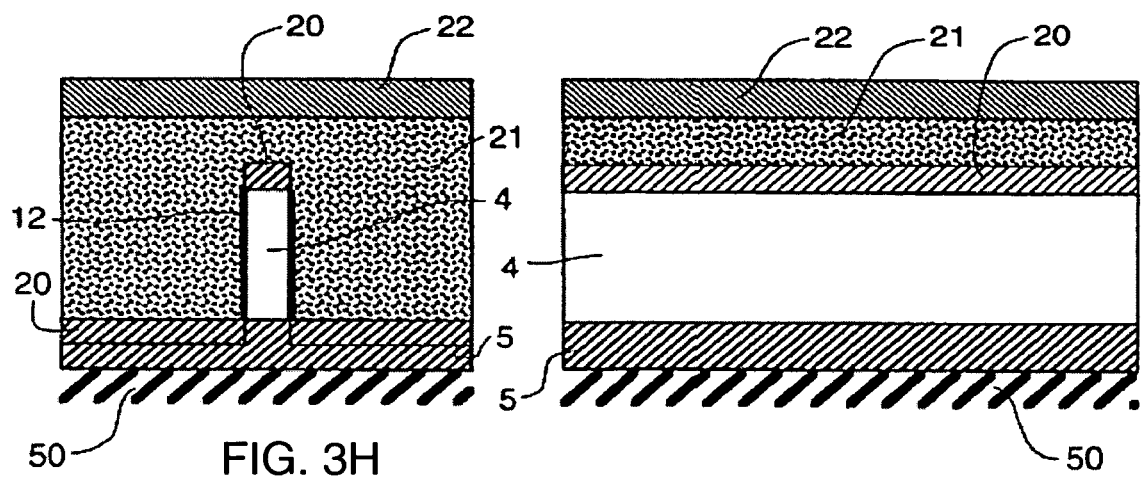

A source/drain halo is next fabricated on top of the fin 4. As shown in FIG. 3G, the poly-silicon layer 21 and the nitride layer 22 are selectively removed such that a segment of the poly-silicon layer 21 and the nitride layer 22 remain above the fin 4. In the next step, as shown in FIG. 3H, the source and drain implants 23 are incorporated on top of the oxide layer 20 and on either side of the halo poly-silicon layer 21.

Figure 3I:
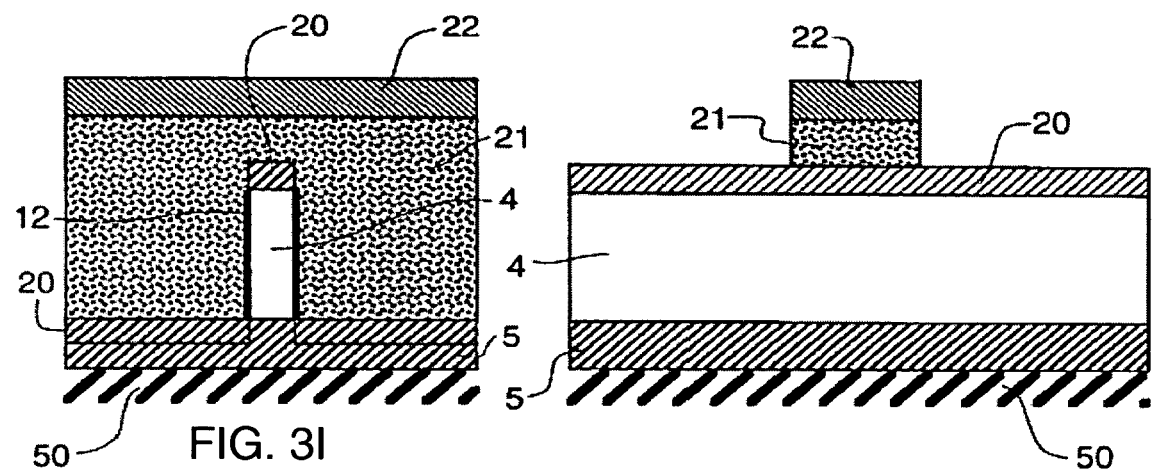
Figure 3J:
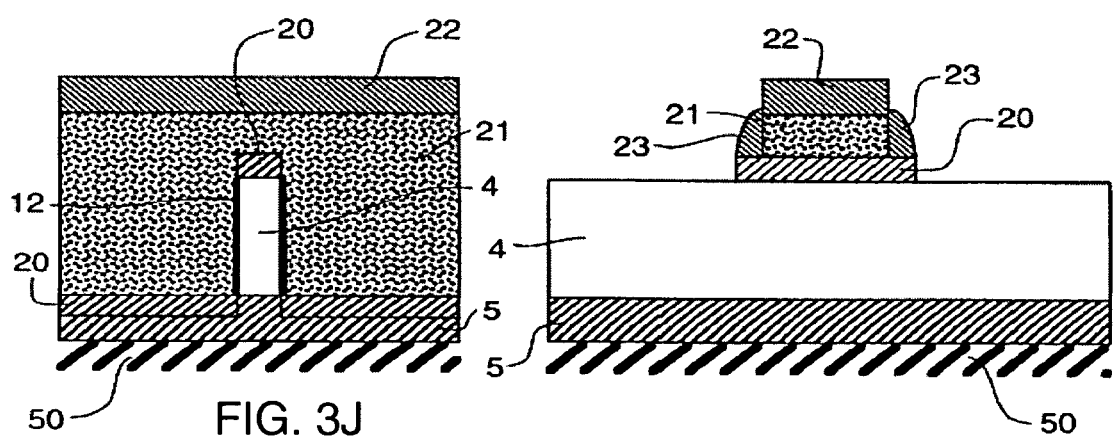

A thick poly-silicon layer 25 is next deposited on top of the fin 4 and the halo elements. Through a polishing process, which may be chemical mechanical polishing, the poly-silicon layer 25 is partially removed and the fin device is planarized to the level of the nitride layer 22 separating the source and drain implants 23. The structure that results after these two steps of the process is shown in FIG. 3I. The thick poly-silicon layer 25 is next etched to a level below the top of the nitride source and drain implants 23 and a thin silicide layer 26 is formed above the poly-silicon layer 25 on either side of the halo as shown in FIG. 3J.

Figure 3K:
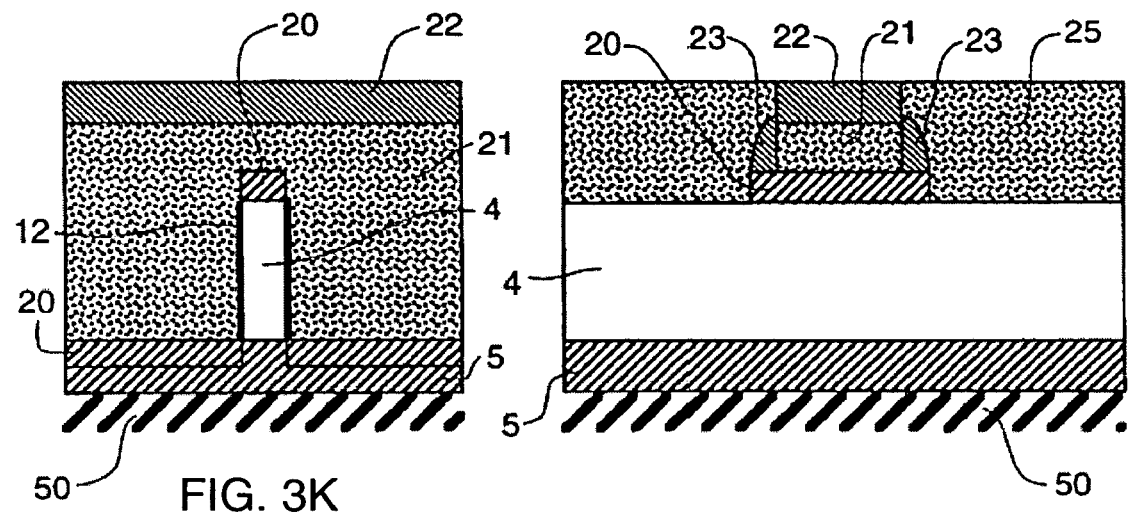
Figure 3L:
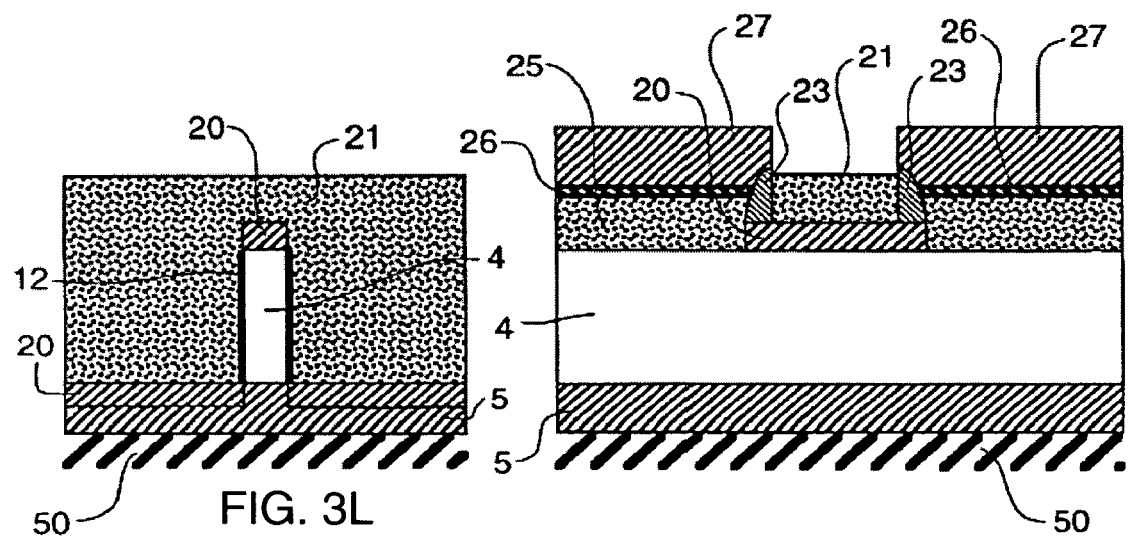

The completed fin device 10, in the present embodiment depicted in FIG. 3K being fully planarized and double gated, allows ten or even more devices to be placed within a one micrometer width and thus preferably can be used as the body of a Field Effect Transistor (FET).

Referring now to the mentioned pre-published article by the present inventors entitled "FinFET Technology for Future Microprocessors" published in 2003 IEEE International SOI Conference, Newport Beach, Calif., page 33-34, ISBN 0-7803-7815-6, therein described is a method for converting an existing planar FET microprocessor design to enable processing in a 0,1 µm Double-Gate FinFET technology. This method is shortly illustrated referring to FIGS. 4A-4C. A requirement for this conversion is that all original masks could be reused, with two additional masks for the FinFET process.

Figure 4A:
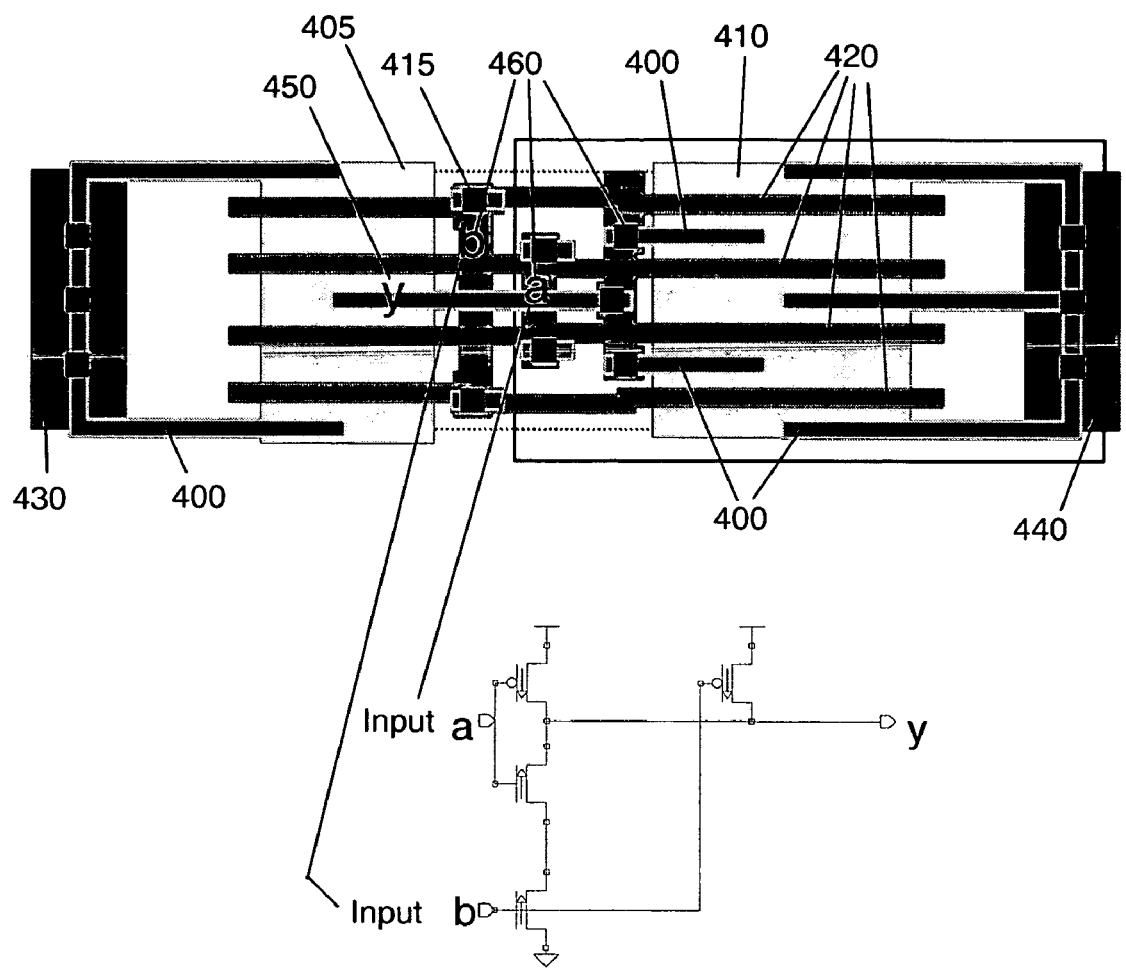
FIGS. 4A-4C are layout views of a 2-way NAND for illustration of a known method for converting an existing design into a double-gated FinFET design.
Figure 4B:
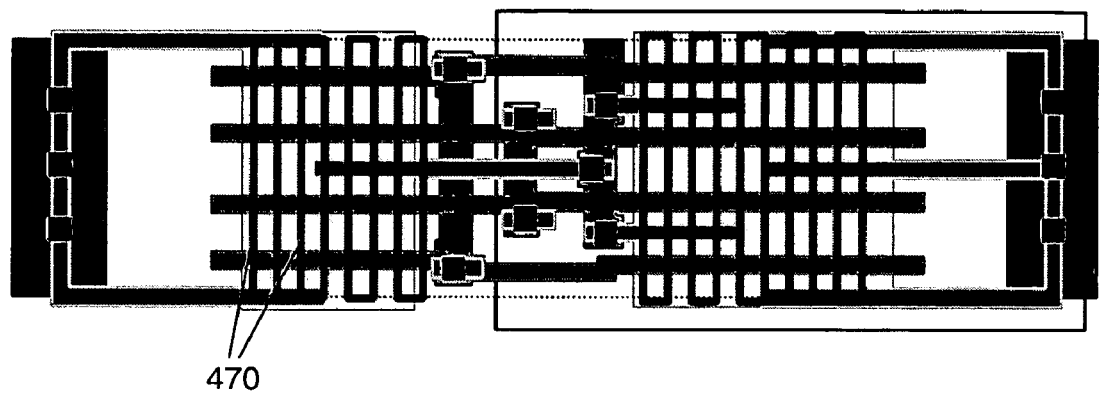
Figure 4C:
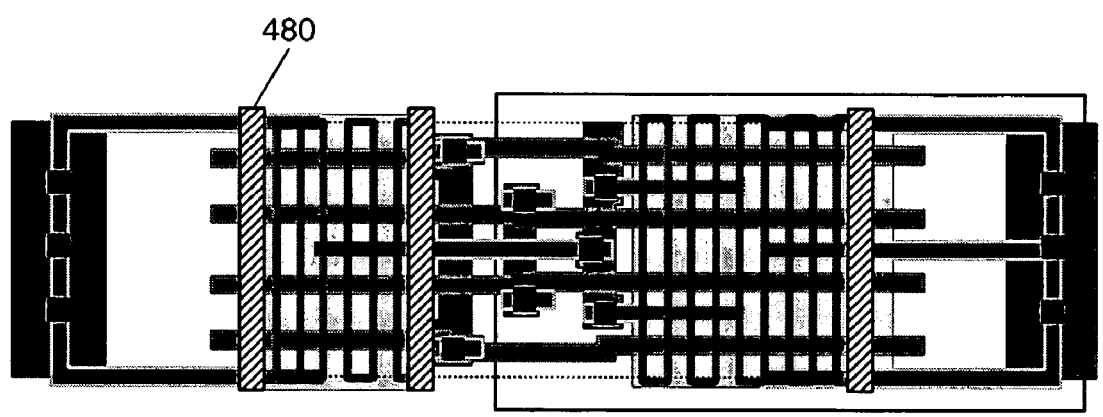

FIGS. 4A-4C particularly illustrate how a standard 2-way NAND layout is altered using the original layers and adding FinFET layer fin (470) and trim (480)

FIG. 4A depicts such a planar layout for a 2-way NAND without fins. In the upper part, the underlying design view is depicted, wherein in the lower part the corresponding logical view is shown. In the design view, the left-hand grey area 405 represents an n-FET region wherein grey area 410 represents a p-FET region. The stripes 400 represent local interconnects and the square-shaped dots 415 local contacts. The stripes 420 arranged horizontally in the present view represent poly-silicon gates. Further, left-hand shaded area 430 is a ground (GND) electrode wherein right-hand shaded area 440 is a voltage supply (VDD) electrode. The stripes 460 arranged vertically in the present view are metal wires.

The horizontal stripe 450 corresponds to the logical output 'y' depicted in the logical view wherein the left-hand two of the above mentioned metal wires 460 correspond to the two logical inputs 'a' and 'b'.

As shown in FIG. 4B, the conventional process is drawing equidistant fin shapes 470 crossing the poly-silicon gate 420 already shown in FIG. 4A.

As illustrated in FIG. 4C, for the mentioned SIT process, an additional loop cutting of fin shapes may be required, for instance, to obtain an odd number of fins or to fulfil or meet certain design rule constraints or for other topology reasons. This cutting is accomplished using the shown trim stripes 480.

Figure 5A:
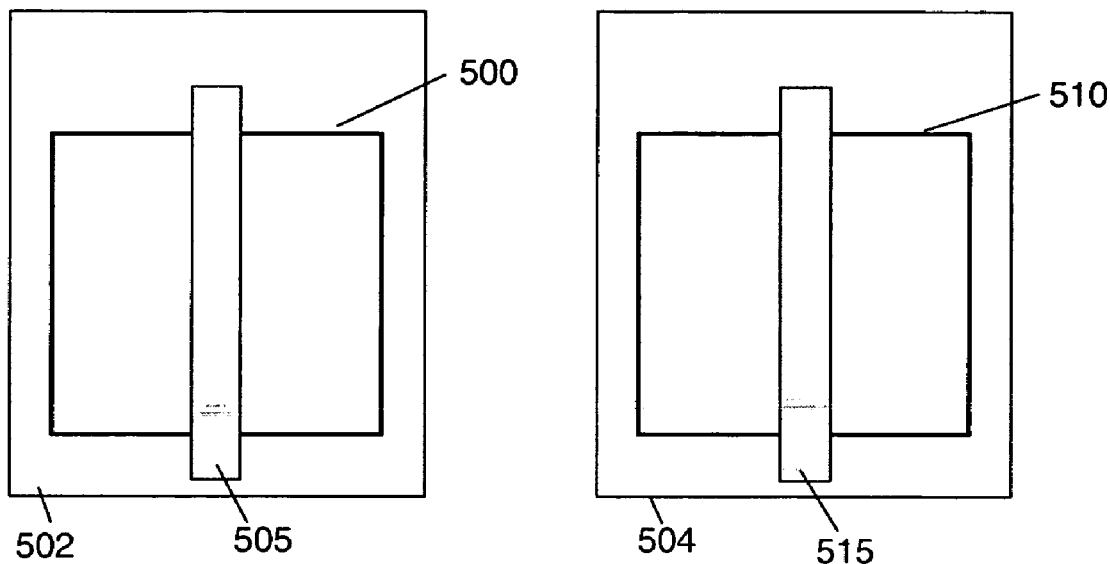
FIGS. 5A-5D depict further layout views of a first embodiment of a method for conversion of an existing design into a double-gated FinFET design according to the present invention.

Now referring to FIGS. 5A-5D the mechanism according to the present invention for resolving the above described violation of design rules is illustrated for two exemplary cell structures 'A' 502 and 'B' 504. As in the previously described structures, both structures 502, 504 include gates 505, 515 lying within gate areas (active areas) 500 and 510. FIG. 5A first illustrates the two cell structures 'A' and 'B' prior to the fin generation in this state being functionally independent from each other. In the present state the underlying design shall be on an hierarchy level n.

Figure 5B:
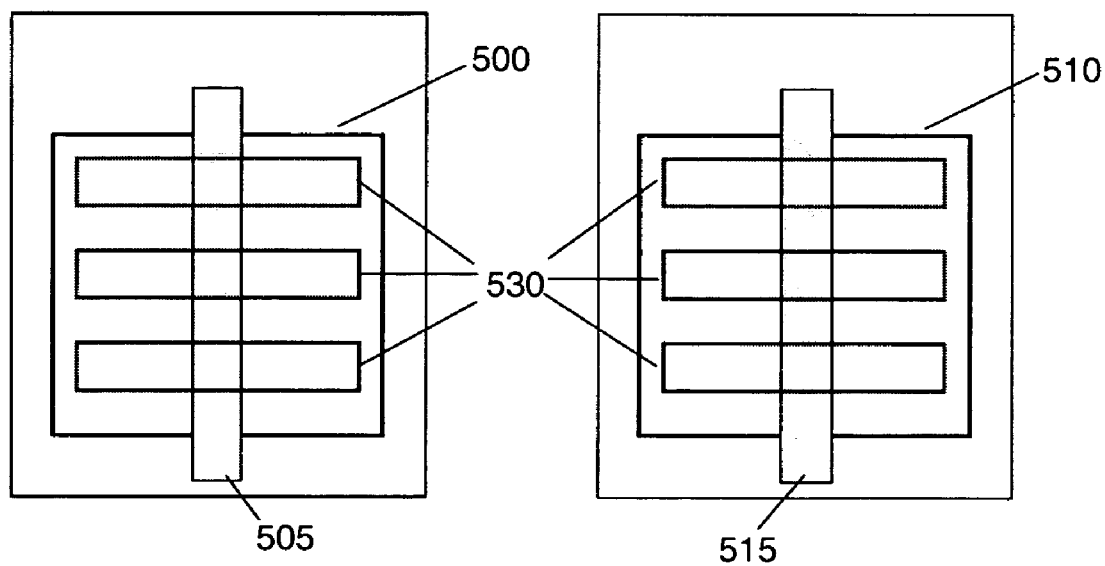

FIG. 5B shows the same cell structures on the same design hierarchy level n being independently filled with fins (fin shapes) 530 within the gate areas 500, 510 using a conventional method. In both structures 502, 504, the fins cross or overlap, respectively, the gates 505, 515.

Figure 5C:
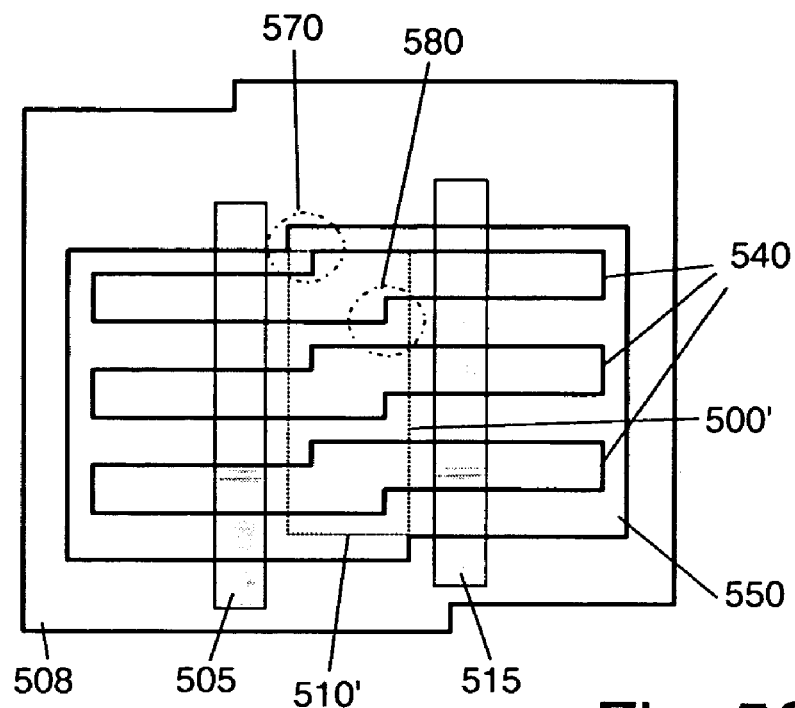
Figure 5D:
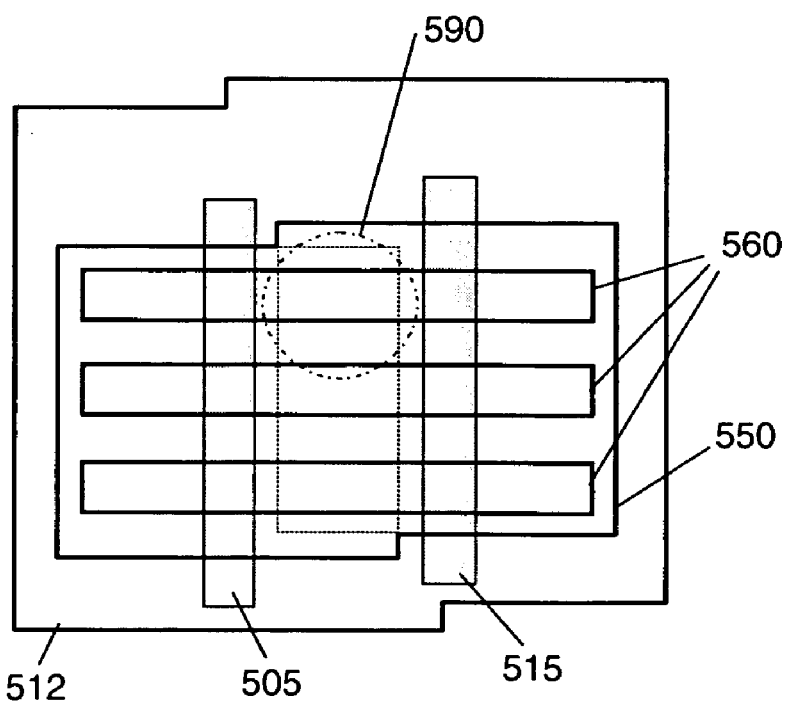

In contrast to FIGS. 5A and 5B, the other FIGS. 5C and 5D show the same cell structures on a next design hierarchy level n+1.

FIG. 5C shows a resulting combined cell structure 'C' 508 including a combined active area 550. The combined active area 550 contains the two single cell structures 'A' 502 and 'B' 504 placed adjacent to each other. The original gate areas, in the overlapping region, are indicated by dotted lines 500', 510'. The structural placement in the original design without considering fins does not violate any design rule. But in this example the resulting combined fin shapes 540 lead to a violation of a design rule related to fin topology in the overlapping region within the indicated two circles 570, 580. This violation is characterized by the step-like shape of the fins, in particular proximity of these steps to the gates 505, 515. This problem is typical for existing layouts not designed originally for fins.

FIG. 5D shows a corresponding cell structure 'C' 512 that contains the same placement of cell structure 'A' and cell structure 'B' 550 but without previously generated fins 540 (FIG. 5C) in cell structure 'A' 502 and cell structure 'B' 504. Considering any placement combinations of cell structure 'A' 502 and cell structure 'B' 504, respectively, to other cell structures, occurring in the design hierarchy. The fin generation tool, in the present design scenario, decides not to place the fins in the hierarchy of cell structure 'A' and cell structure 'B'. The fin generation is delegated to the hierarchy above thus revealing a combined fin shape 560 without any steps, as indicated by circle 590.

In this example the fin generation to cell structure 'C' with respect to the fins placed over cell structure 'A' and cell structure 'B' can be established, because there are no contradictions in the cell structure 'C' placement hierarchy. Otherwise the placement of the fins gets delegated again to the next hierarchy n+2.

As a last resort any remaining fins can be generated without contradiction on the highest level of hierarchy because this cell structure is only used once.

Figure 6A:
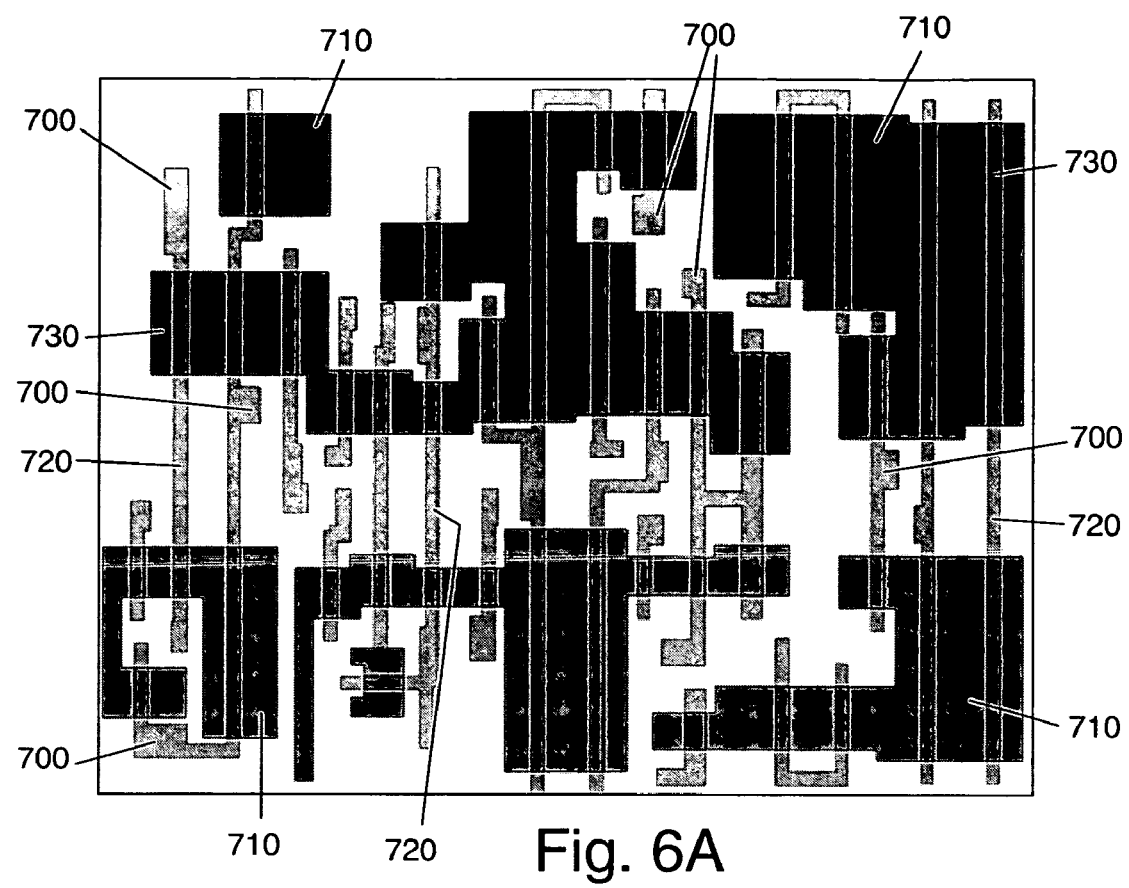
FIGS. 6A-6F depict according layout views of a second embodiment of a method for conversion of an existing design into a double-gated FinFET design according to the present invention.
Figure 6B:
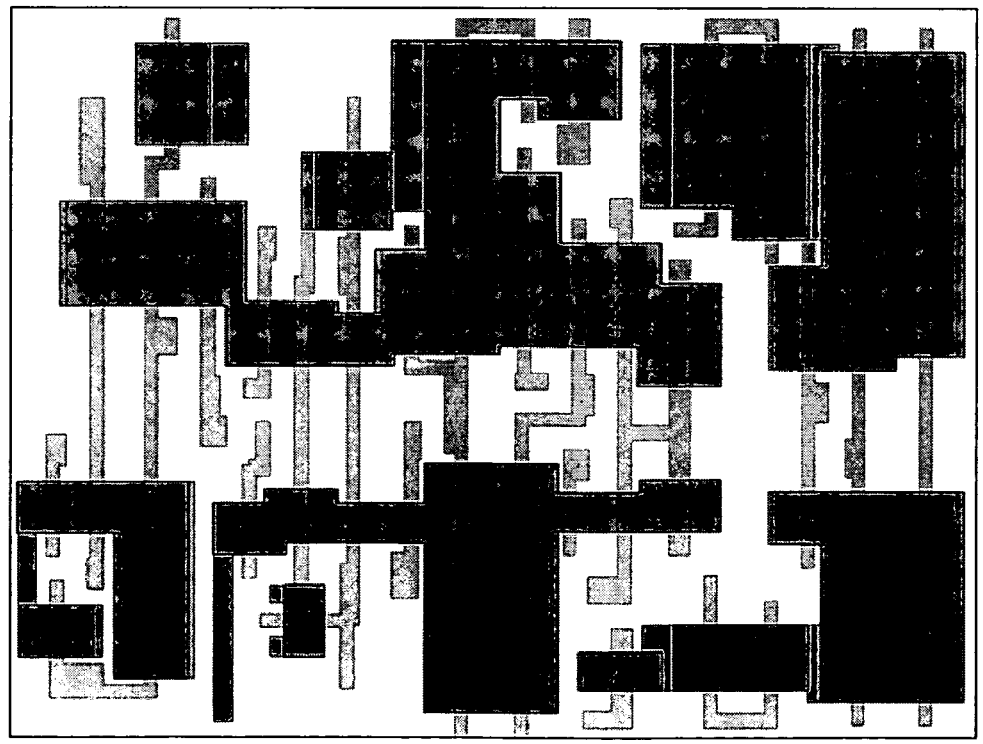
Figure 6C:
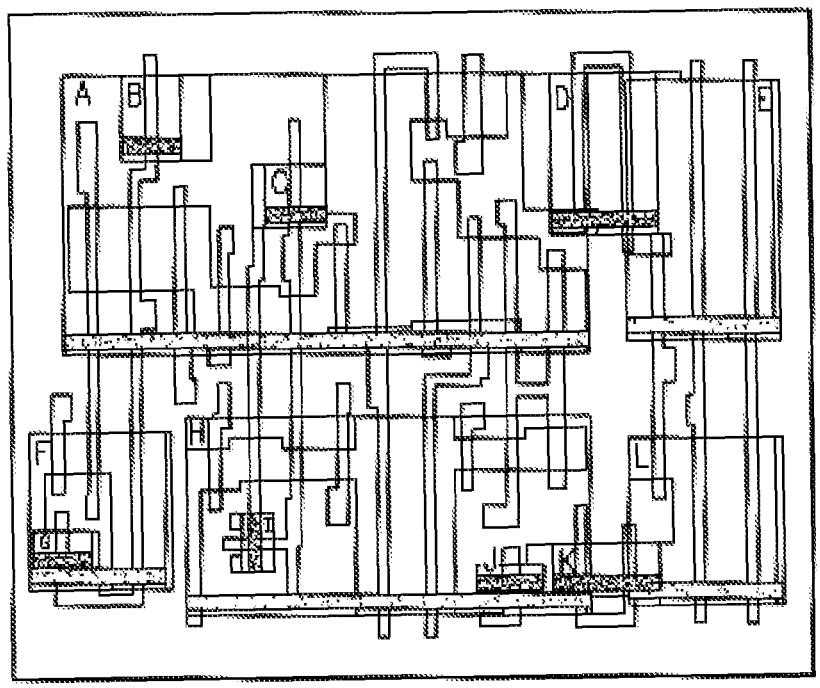
Figure 6D:
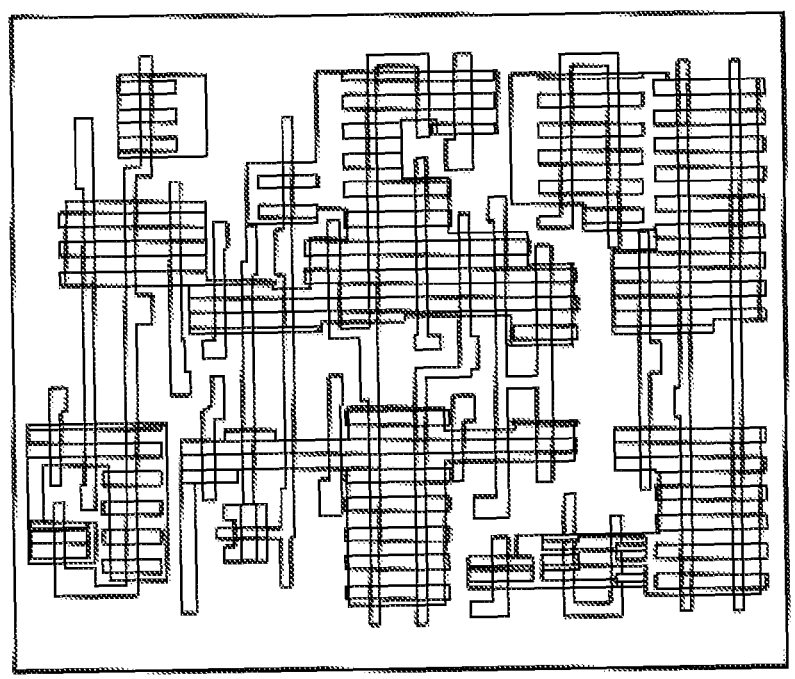
Figure 6E:
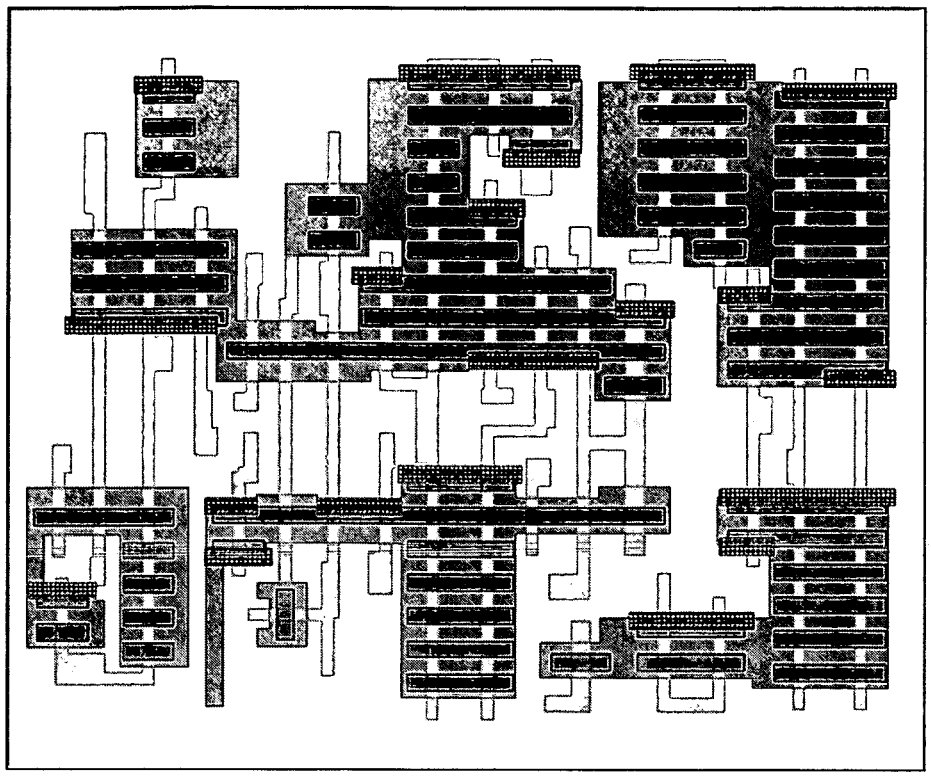
Figure 6F:
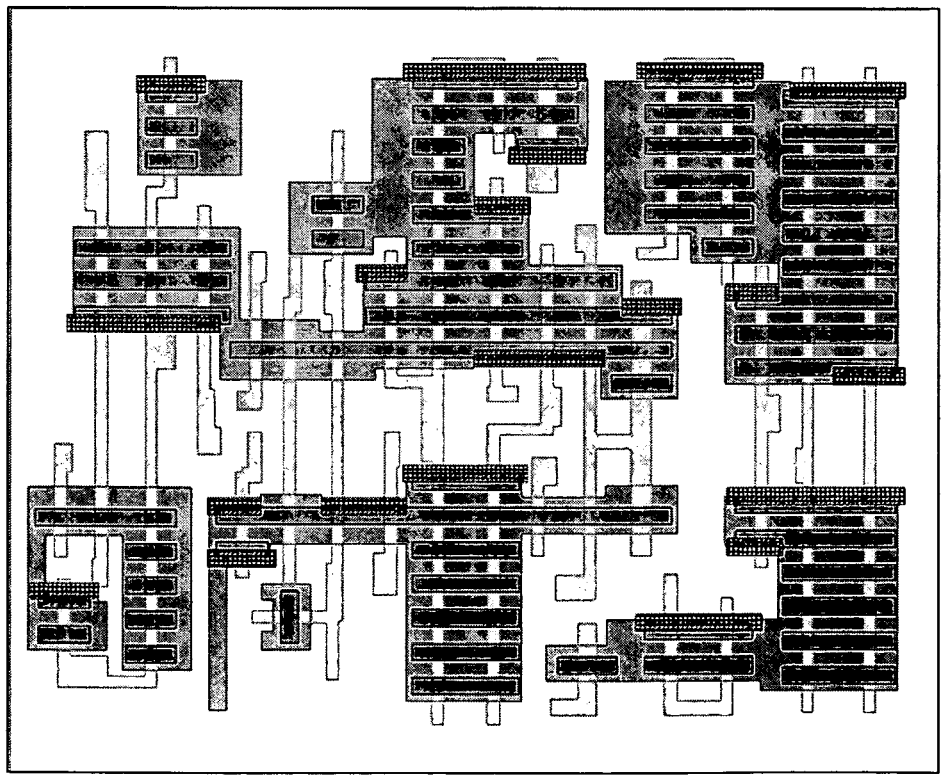
Figure 7:
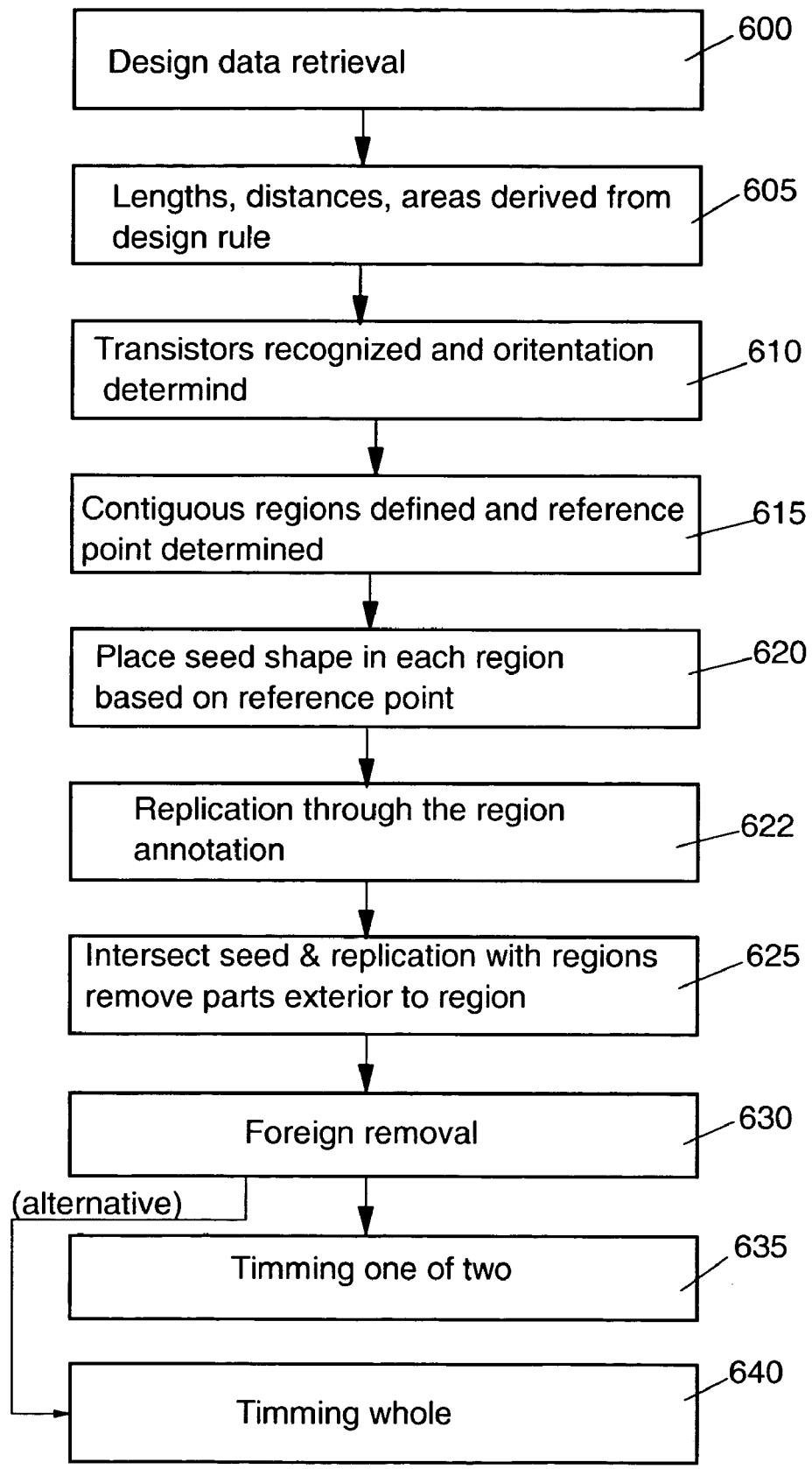
FIG. 7 depicts a flow diagram illustrating a preferred embodiment of the method for the conversion of an existing design into a double-gated FinFET design, in accordance with the present invention.

Finally, referring to FIG. 7, a preferred embodiment of the herein proposed method for the conversion of an existing planar design into a double-gated FinFET design is shown in greater detail. During the description of FIG. 7, FIGS. 6A-6F are only used as references in order to illustrate the resulting consequences for the entire chip design.

In a first step 600 (see also FIG. 6A), information about the existing planar CMOS design is retrieved. In FIG. 6A, the bright-grey shaded areas 700 (only some of them indicated in the drawing by reference signs) represent gates and the dark-grey shaded areas 710 source/drain fusion regions for the underlying FETs or diffusion areas, respectively. Further, the stripe-like shapes 720 represent poly-silicon gates used as conductive connections only. Finally, the darkly colored outer shapes 730 the poly-silicon gates existing within the fusion regions 710 represent channels or gates (see above).

The retrieved data (step 600) may be hierarchically structured or not, but in the present embodiment are hierarchy utilized in the proposed flow. In the following step 605, lengths, distances, and areas in this flow are derived from the FinFET design rules and conventional CMOS design rules. In step 610, the conventional CMOS transistor devices 'Tx' are recognized and their orientation being determined. In the next step 615 (see FIG. 6B), contiguous regions requiring joint processing are defined and a reference point for each region being determined.

In addition, in step 620 a seed structure is placed (see FIG. 6C) in each region, based on the location of the reference point. This seed structure reflects two FinFETs per gate contact and is annotated with information about the region it belongs to. In step 622 (see also FIG. 6D), the seed structure is replicated throughout the region. The information about the region it belongs to is passed on to the replicated structures. This information is important to select the appropriate structure in case of overlaps with disjoint regions later.

In the following step 625, the pattern of seed and replicated structures is intersected with the regions, removing parts exterior to the region. In the next step 630 (see also FIG. 6E), it is evaluated, if the decision whether a presently treated structure is "foreign" to the region can be based on the annotated information mentioned above.

It is to be noted that the structures remaining after intersection define the first additional layer used for the SIT process mandrel and intermediate layer for conventional process. Structures near the boundary of the regions have to be adjusted, based on their size. They are either trimmed or completely removed.

A further step 635 (see FIG. 6F) is trimming one of two structures where the size of the intersected structure is sufficient for one FinFET. In this case, one of the two FinFETs is trimmed, the other remains. The trim information is represented on a second additional layer for the SIT process. For conventional process the trim structure is internally used to cut-back the first layer to generate the fin layer.

If the intersected structure is too small, even for one FinFET, in an alternative step 640 the structure is removed from the mandrel layer for the SIT process and from the fin layer for the conventional process.

The existing design data as well as the newly generated design data are now available. To manipulate the design data, a general purpose shapes processing engine (e.g. the "Niagara" engine available from the present assignee) can be used. This engine is controlled by a set of statements which reflects the aforementioned flow.

What is claimed is:

1. A method for generating integrated circuit designs according to design rules, the circuit designs comprising fin-shaped structures (FinFET fins), comprising the steps of:

designing a first cell structure at a first design hierarchy level, the first cell structure comprising first regions for one or more first fin-shaped structures;

designing a second cell structure at the first design level, the second cell structure comprising second regions for one or more second fin-shaped structures, the second fin-shaped structures combining with the first fin-shaped structures forming one or more combined fin-shaped structure;

when the first regions of the first cell structure in combination with the second regions of the second cell structure result in no design rule violation, generating the combined fin-shaped structure at the first design level; and when the first regions of the first cell structure in combination with the second regions of the second cell structure result in a design rule violation, generating the combined fin-shaped structure at a second design level, wherein the second design level comprises a larger contiguous region of fin-shaped structures than the regions of fin-shaped structures of the first design level.

2. The method according to claim 1 wherein a design rule comprises any one of fin-shaped structure topology in an overlapping region between two fin-shaped structures or another interference between proximate fin-shaped structures.

3. A method for converting a non fin-shaped integrated circuit design into a corresponding fin-shaped integrated circuit design according to design rules, the method comprising the steps of:

designing a first cell structure at a first design hierarchy level, the first cell structure derived from a cell of a non fin-shaped integrated circuit design, the first cell structure comprising first regions for one or more first fin-shaped structures;

designing a second cell structure at the first design level, the first cell structure derived from a cell of a non fin-shaped integrated circuit design, the second cell structure comprising second regions for one or more second fin-shaped structures, the second fin-shaped structures combining with the first fin-shaped structures forming one or more combined fin-shaped structure;

when the first regions of the first cell structure in combination with the second regions of the second cell structure result in no design rule violation, generating the combined fin-shaped structure at the first design level; and when the first regions of the first cell structure in combination with the second regions of the second cell structure result in a design rule violation, generating the combined fin-shaped structure at a second design level, wherein the second design level comprises a larger contiguous region of fin-shaped structures than the regions of fin-shaped structures of the first design level.

4. The method according to claim 3 wherein a design rule comprises any one of fin-shaped structure topology in an overlapping region between two fin-shaped structures or another interference between proximate fin-shaped structures.

5. A computer program product for generating integrated circuit designs according to design rules, the circuit designs comprising fin-shaped structures (FinFET fins), the computer program product comprising:

a storage medium readable by a processing circuit and storing instructions for execution by a processing circuit for performing a method comprising the steps of:

designing a first cell structure at a first design hierarchy level, the first cell structure comprising first regions for one or more first fin-shaped structures;

designing a second cell structure at the first design level, the second cell structure comprising second regions for one or more second fin-shaped structures, the second fin-shaped structures combining with the first fin-shaped structures forming one or more combined fin-shaped structure;

when the first regions of the first cell structure in combination with the second regions of the second cell structure result in no design rule violation, generating the combined fin-shaped structure at the first design level; and when the first regions of the first cell structure in combination with the second regions of the second cell structure result in a design rule violation, generating the combined fin-shaped structure at a second design level, wherein the second design level comprises a larger contiguous region of fin-shaped structures than the regions of fin-shaped structures of the first design level.

6. The computer program product according to claim 5 wherein a design rule comprises any one of fin-shaped structure topology in an overlapping region between two fin-shaped structures or another interference between proximate fin-shaped structures.

7. An apparatus for generating integrated circuit designs according to design rules, the circuit designs comprising fin-shaped structures (FinFET fins), the apparatus comprising a computer performing the steps of:

designing a first cell structure at a first design hierarchy level, the first cell structure comprising first regions for one or more first fin-shaped structures;

designing a second cell structure at the first design level, the second cell structure comprising second regions for one or more second fin-shaped structures, the second fin-shaped structures combining with the first fin-shaped structures forming one or more combined fin-shaped structure;

when the first regions of the first cell structure in combination with the second regions of the second cell structure result in no design rule violation, generating the combined fin-shaped structure at the first design level; and when the first regions of the first cell structure in combination with the second regions of the second cell structure result in a design rule violation, generating the combined fin-shaped structure at a second design level, wherein the second design level comprises a larger contiguous region of fin-shaped structures than the regions of fin-shaped structures of the first design level.

8. The apparatus according to claim 7 wherein a design rule comprises any one of fin-shaped structure topology in an overlapping region between two fin-shaped structures or another interference between proximate fin-shaped structures.

* * * * *